United States Patent
Madan (10) Patent No.: US 7,804,702 B2
(45) Date of Patent: Sep. 28, 2010

(54) FERROELECTRIC MEMORY CELL WITH ACCESS TRANSMISSION GATE

(75) Inventor: Sudhir K. Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 476 days.

(21) Appl. No.: 12/040,547

(22) Filed: Feb. 29, 2008

(65) Prior Publication Data

US 2009/0168490 A1    Jul. 2, 2009

Related U.S. Application Data

(60) Provisional application No. 61/017,375, filed on Dec. 28, 2007.

(51) Int. Cl.
*G11C 11/22* (2006.01)

(52) U.S. Cl. .................... 365/145; 365/149

(58) Field of Classification Search ............ 365/145, 365/149

See application file for complete search history.

(56) References Cited

U.S. PATENT DOCUMENTS

| | | | | |
|---|---|---|---|---|
| 5,459,686 A | * | 10/1995 | Saito | 365/149 |
| 5,623,440 A | * | 4/1997 | Saito | 365/149 |
| 5,898,619 A | | 4/1999 | Chang et al. | |
| 7,379,319 B2 | * | 5/2008 | Takashima | 365/143 |

\* cited by examiner

*Primary Examiner*—VanThu Nguyen
(74) *Attorney, Agent, or Firm*—Rose Alyssa Keagy; W. James Brady; Frederick J. Telecky, Jr.

(57) ABSTRACT

One embodiment relates to an integrated circuit that includes a ferroelectric memory cell. The ferroelectric memory cell includes a ferroelectric capacitor having a first plate and a second plate. The first plate is associated with a storage node of the ferroelectric memory cell, and the second plate associated with a plateline. The ferroelectric memory cell also includes a complementary transmission gate configured to selectively couple the storage node to a bitline as a function of a wordline voltage and a complementary wordline voltage. Bias limiting circuitry selectively alters voltage on the storage node as a function of the wordline voltage or the complementary wordline voltage. Other methods, devices, and systems are also disclosed.

25 Claims, 9 Drawing Sheets

FERROELECTRIC MEMORY CELL WITH ACCESS TRANSMISSION GATE

RELATED APPLICATION

This application claims priority to Ser. No. 61/017,375 filed Dec. 28, 2007, which is entitled "FERROELECTRIC MEMORY CELL WITH ACCESS TRANSMISSION GATE".

FIELD OF INVENTION

The present invention relates generally to semiconductor memory devices and more particularly to improved methods and systems for ferroelectric memory devices.

BACKGROUND OF THE INVENTION

Semiconductor memory devices store data and/or program code in personal computer systems, embedded processor-based systems, video image processing circuits, communications devices, and the like. A ferroelectric memory device is one type of semiconductor memory device.

Ferroelectric memory devices provide non-volatile data storage by employing ferroelectric capacitors that are constructed using ferroelectric dielectric material that may be polarized in one direction or another in order to store a binary value. The ferroelectric effect allows for the retention of a stable polarization in the absence of an applied electric field due to the alignment of internal dipoles within perovskite crystals in the ferroelectric material. This alignment may be selectively achieved by application of an electric field in a first direction that exceeds a coercive field of the material. Conversely, reversal of the applied field reverses the internal dipoles, wherein the response of the polarization of a ferroelectric capacitor to the applied voltage may be plotted as a hysteresis curve.

Given the technological complexity of ferroelectric memory devices, these products require significant capital expenditures in order to be successfully developed and delivered to the marketplace. Thus, developers rely on strong intellectual property rights in this arena to allow them to rationalize and protect the huge capital expenses involved.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment relates to an integrated circuit that includes a ferroelectric memory cell. The ferroelectric memory cell includes a ferroelectric capacitor having a first plate and a second plate. The first plate is associated with a storage node of the ferroelectric memory cell, and the second plate associated with a plateline. The ferroelectric memory cell also includes a complementary transmission gate configured to selectively couple the storage node to a bitline as a function of a wordline voltage and a complementary wordline voltage. Bias limiting circuitry selectively alters voltage on the storage node as a function of the wordline voltage and or the complementary wordline voltage. Other methods, devices, and systems are also disclosed.

The following description and annexed drawings set forth in detail certain illustrative aspects and implementations of the invention. These are indicative of only a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout. Although some embodiments of the invention are described below with reference to a 32 kb ferroelectric memory device, it will be appreciated that the invention could extend to any ferroelectric memory device, regardless of size. For example, a ferroelectric memory device could be much smaller (e.g., a 1 bit device with a single ferroelectric memory cell) or could be much larger (e.g., a gigabit device including at least approximately $2^{32}$ ferroelectric memory cells), where all such variations are contemplated as falling within the scope of the invention.

Figure 1:
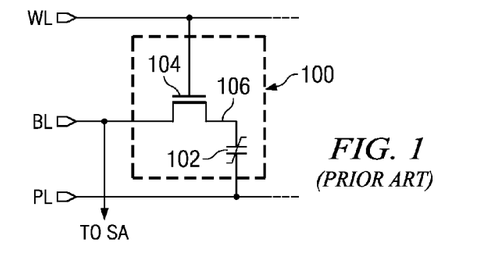
FIG. 1 is a schematic diagram illustrating a somewhat conventional 1T1C ferroelectric memory cell.

Ferroelectric memory cells in accordance with the invention can be organized in single-transistor, single-capacitor (1T1C) or two-transistor, two-capacitor (2T2C) configurations. FIG. 1 illustrates a 1T1C ferroelectric memory cell 100 that includes a single ferroelectric capacitor 102 and an access transistor 104 with a storage node 106 therebetween. The access transistor 104 serves to selectively connect the storage node 106 to a bitline BL, such that the cell capacitor 102 is effectively coupled between the bitline BL and a plateline PL. By applying suitable voltages to the bitline BL and plateline PL, the ferroelectric capacitor 102 can be put into different ferroelectric states, each of which corresponds to a different data state.

Figure 2:
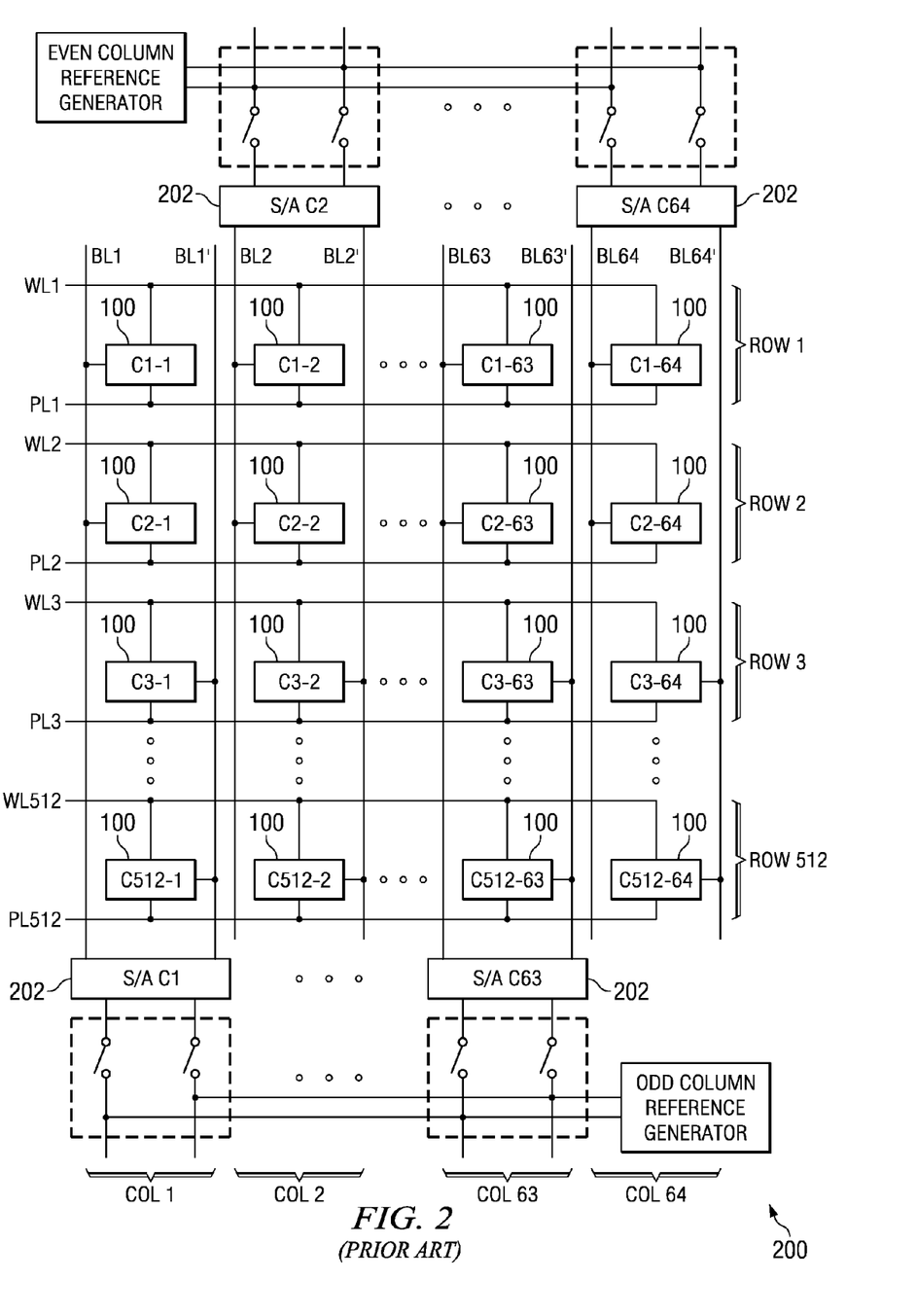
FIG. 2 is a schematic diagram illustrating a somewhat conventional 1T1C folded bitline ferroelectric memory device.

FIG. 2 illustrates a somewhat conventional 32 kilobit (32 Kb) ferroelectric memory device 200, where memory cells 100 are arranged in 512 rows (words) and 64 columns (bits), indicated as $C_{ROW\text{-}COLUMN}$. Each row of memory cells is associated with a unique wordline WL and plateline PL, and each column of memory cells is associated with a unique pair of complementary bitlines $BL_{COLUMN}$ and $BL_{COLUMN}$'. In Row 1, for example, the cells $C_{1\text{-}1}$ through $C_{1\text{-}64}$ form a 64 bit data word associated with WL1, PL1, and complementary bitline pairs BL1/BL1' through BL64/BL64'.

During a typical write operation to Row 1, a wordline voltage ($V_{wl}$) is applied to wordline WL1, wherein $V_{wl}$ is typically greater than or equal to a supply voltage ($V_{DD}$) plus a threshold voltage ($V_T$) of the access transistors 104, thereby turning on the access transistors 104 within Row 1 and coupling the bitlines BL1-BL64 to the ferroelectric capacitors 102 in the accessed cells 100. Suitable voltages are then applied to the bitlines BL1-BL64, where the voltage on each bitline is representative of a data value to be written to the memory cell attached to that bitline. While the wordline WL1 is biased high and bitlines BL1-BL64 are properly biased, the plateline PL1 is pulsed high, polarizing the ferroelectric dielectric material, and thereby storing one of at least two data states in each of the accessed memory cells. Before the WL1 is returned to low state, the bitlines are discharged to ground.

During a typical read operation of Row 1, $V_{wl}$ is again applied to wordline WL1 to turn on the access transistors 104 and couple the bitlines BL1-BL64 to the ferroelectric capacitors 102 of the accessed cells 100. The plateline PL1 is then pulsed high, causing the ferroelectric capacitors 102 to discharge charge through the access transistors 104 to the bitlines BL1-BL64, thereby causing the bitline voltages BL1-BL64 to rise. The amount by which the bitline voltages rise depends upon the state of the ferroelectric capacitors being accessed. To determine whether the state of the accessed ferroelectric capacitors is a "1" or a "0", one differential input terminal of each sense amp 202 is coupled to a memory cell's bitline (e.g., bitline BL1) and the other differential input of each sense amp 202 is coupled to a reference voltage (e.g., reference bitline BL1' in this example). Depending upon whether the memory cell's bitline (e.g., bitline BL1) is high or low relative to the reference voltage (e.g., bitline BL1'), each sense amp 202 returns a "1" or a "0".

As the inventors have appreciated, however, such a memory device 200 is less than ideal for several reasons. For example, it is often desirable to provide a wide voltage range at each cell's storage node 106, thereby allowing the ferroelectric capacitor 102 to be programmed via a strong positive bias (e.g., "0" state) or a strong negative bias (e.g., a "1" state). In essence, the wide voltage range at the storage node 106 ensures that the ferroelectric capacitor 102 can be programmed in the saturation region of the hysteresis curve. In previously discussed memory cell 100, however, the bitline voltage will experience a voltage drop over the access transistor 104, thereby limiting the voltage range achievable at the storage node 106. To mitigate this voltage drop, previous solutions have provided a boosted $V_{wl}$ (i.e., $V_{wl} \geq V_{DD} + V_t$). However, this high $V_{wl}$ can degrade the reliability of the gate oxide associated with the access transistor 104 and can also cause gate leakage, which could impact functionality and/or sensing margins. Also, boosting $V_{wl}$ over $V_{DD}$ can add to the complexity of the circuit which sometimes consumes significant power. These problems are expected to increase as the feature sizes of devices and voltage associated therewith are reduced in future semiconductor manufacturing flows. Thus, it would be advantageous to limit the voltage drop between the bitline BL and the storage node 106, thereby allowing a relatively large voltage range to be applied at the storage node 106.

To remedy these and other shortcomings, the inventors have fashioned advantageous ferroelectric memory cells. Three examples will be discussed below, along with manufacturing methods and sample layouts. In each of these examples, a complementary transmission gate is used to selectively couple a cell's bitline to the cell's storage node. The complementary transmission gate allows a cell's storage node to be coupled to a bit line voltage with minimal voltage drop, such that the voltage on the storage node can range from approximately $V_{DD}$ to approximately $V_{SS}$. This may be accomplished by applying a voltage of 0V (PMOS) and $V_{DD}$ (NMOS) to the gates of the complementary transmission gates, instead of a boosted $V_{DD}$. In addition, the examples include bias limiting circuitry that limits undesirable bias across the ferroelectric capacitor.

Figure 3:
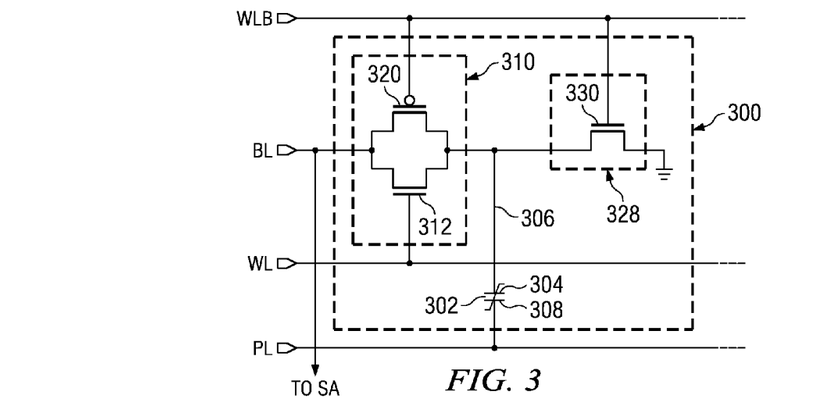
FIG. 3 is a schematic diagram illustrating an embodiment of a 3T1C ferroelectric memory cell in accordance with some aspects of the invention.

Referring now to FIG. 3, one can see an example of a ferroelectric memory cell 300 that includes three-transistors and one ferroelectric capacitor (i.e., a 3T1C cell). The ferroelectric capacitor 302 has a first plate 304 coupled to a storage node 306 and a second plate 308 coupled to a plateline PL. A complementary transmission gate 310 selectively couples the storage node 306 to a bitline BL as a function of a wordline voltage and a complementary wordline voltage, which are provided on the wordline (WL) and complementary wordline (wordline bar WLB), respectively.

In the illustrated embodiment, the complementary transmission gate 310 includes a first NMOS transistor 312 comprising: a first n-type source/drain region coupled to the bitline BL, a gate on which the wordline voltage is provided, and a second n-type source/drain region coupled to the storage node 306. The complementary transmission gate 310 also includes a PMOS transistor 320 comprising: a first p-type source/drain region coupled to the bitline BL, a gate on which the complementary wordline voltage is provided, and a second p-type source/drain region that is coupled to the storage node 306.

Absent countermeasures, charge or voltage can undesirably develop on the storage node 306. For example, charge could leak from the n-well (which is at VDD) of the PMOS transistor 320 onto the storage node 306. This leaked charge can cause an undesirable bias across the ferroelectric capacitor 302, depolarizing the ferroelectric capacitor and destroying any data state therein. To reduce the adverse effects of this leaked charge, the memory cell 300 also includes bias limiting circuitry 328 to adjust the voltage of the storage node 306 to limit undesirable bias. In FIG. 3's embodiment, the bias limiting circuitry 328 comprises an NMOS transistor 330 that selectively couples the storage node 306 to ground ($V_{SS}$). More specifically, the NMOS transistor 330 has a gate tied to the complementary wordline WLB, a source/drain region coupled to the storage node 306, and a drain/source region coupled to $V_{SS}$. In other embodiments, the bias limiting circuitry could comprise a complementary transmission gate with p-ch transistor gate tied to WL and n-ch transistor gate tied to WLB.

This memory cell 300 could often be used in a memory array such as shown in FIG. 2, where each row of memory cells is associated with a unique wordline and a unique plateline. Accordingly, when the memory cell is being accessed, the wordline voltage on WL is high (which enables NMOS transistor 312), and the complimentary wordline voltage on WLB is low (which enables PMOS transistor 320 and disables NMOS transistor 330). Because of the complementary nature of the complementary transmission gate 310, this condition effectively couples the storage node 306 to the bitline BL such that there is a limited (e.g., approximately 0 V) voltage drop between the bitline BL and the storage node 306.

When the cell is not accessed, the wordline voltage on WL is low (which disables NMOS transistor 312), and the complementary wordline voltage on WLB is high (which disables PMOS transistor 320 and enables NMOS transistor 330). Correspondingly, the NMOS transistor 330 discharges any undesired voltage that would otherwise build on the storage node 306, thereby keeping the storage node at $V_{SS}$. Because the plateline PL is typically held at $V_{SS}$ while the cell is not accessed, both the storage node 306 and the plateline PL are kept at the same voltage (i.e., $V_{SS}$). Thus, the ferroelectric capacitor 302 will not be undesirably biased, and the data bit stored in the cell will tend to remain in tact.

Figure 11:
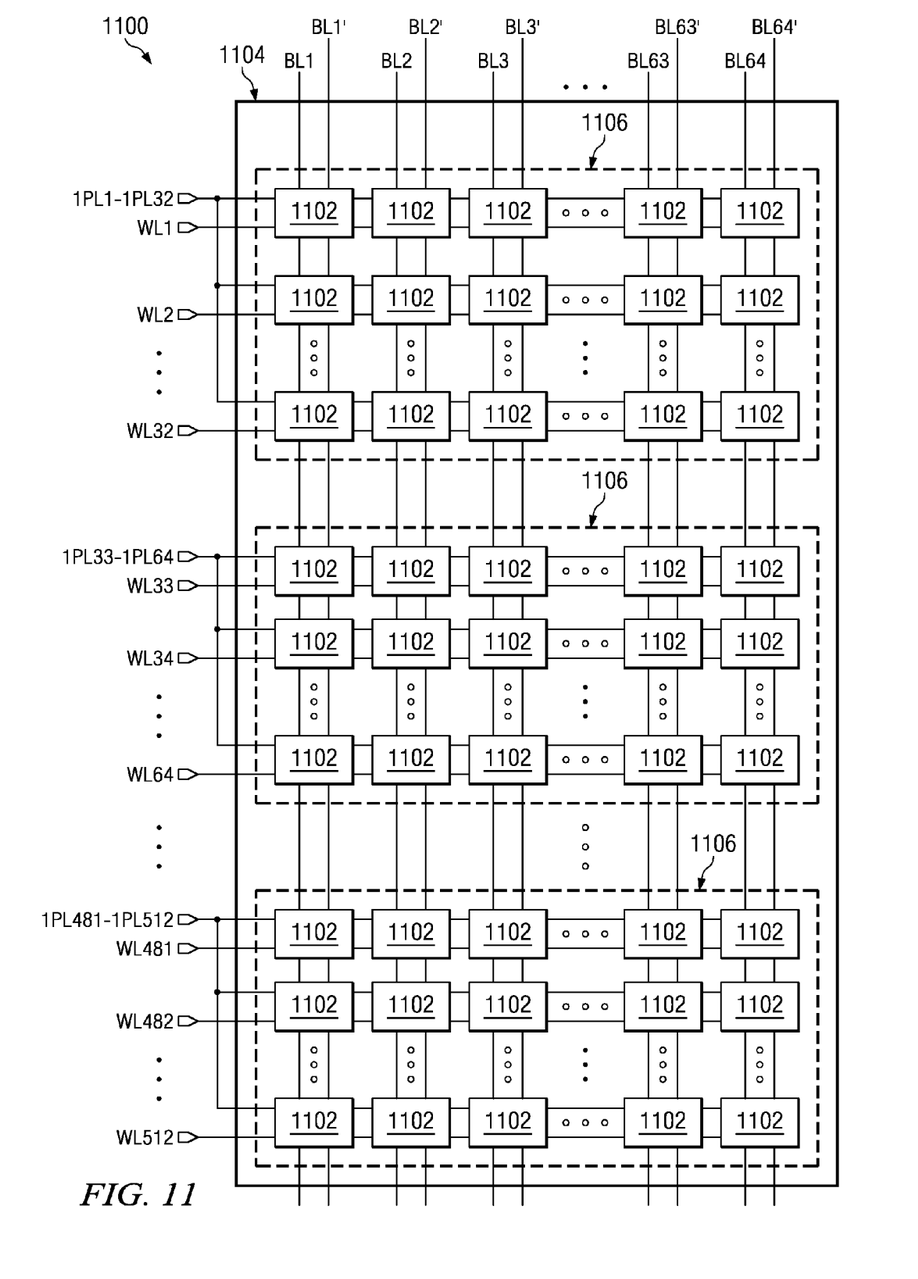
FIG. 11 shows an example of memory device with a common plateline architecture.

While FIG. 3 does limit some undesirable biasing in some architectures (e.g., FIG. 2's architecture), FIG. 3's embodiment may be insufficient in a common plateline configuration, such as shown in FIG. 11. In a common plateline configuration 1100, memory cells 1102 within a segment 1104 are arranged into plategroups 1106. Within a given plategroup 1106, there are several rows of memory cells that share a common plateline driver (e.g., 1PL1-1PL32), but each row has its own wordline driver (e.g., WL1). If FIG. 3's embodiment were to be used with this common plateline configuration 1100, for unselected cells with a low wordline voltage, the bias limiting circuitry 328 will hold their storage nodes 306 at $V_{SS}$. When the unaccessed cells' plateline, however, is pulsed high to program other cells in the plategroup, a large bias will develop across the ferroelectric capacitors 302 in the unselected cells. More specifically, the platelines PL could have a voltage of approximately $V_{DD}$ while the storage node 306 of the unaccessed cells would have a voltage of approximately $V_{SS}$ due to the bias limiting circuitry 328. This unwanted bias can potentially destroy the data stored in the cell.

Figure 4:
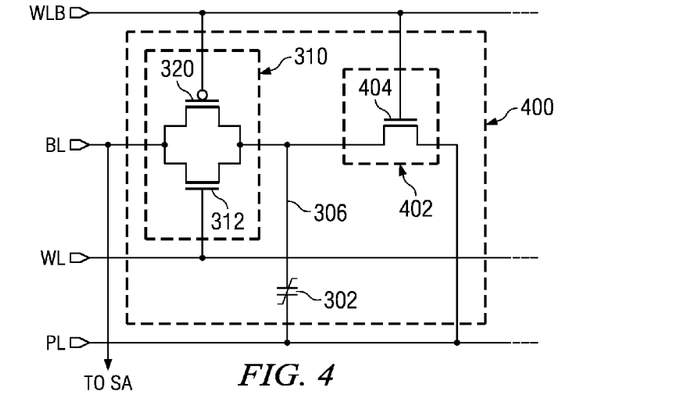
FIG. 4 is a schematic diagram illustrating another embodiment of a 3T1C ferroelectric memory cell in accordance with some aspects of the invention.

Turning now to FIG. 4, one can see another embodiment of a memory cell 400 that remedies this deficiency and which is suitable for use in a common plateline configuration (e.g., 1100). In this embodiment, the memory cell 400 includes a ferroelectric capacitor 302, storage node 306, and complementary transmission gate 310 as previously discussed. The memory cell also includes bias limiting circuitry 402. However, unlike the previously discussed bias limiting circuitry 328 which selectively coupled the storage node 306 to VSS, this bias limiting circuitry 402 selectively couples the storage node 306 to the plateline PL to avoid undesired bias across the ferroelectric capacitor 302. In the illustrated embodiment, for example, the bias limiting circuitry 402 includes an NMOS transistor 404 having a source/drain coupled to the storage node 306, a gate coupled to the complementary wordline WLB, and a drain/source coupled to the plateline PL.

Like FIG. 3's previously discussed embodiment, when the memory cell is being accessed, the wordline voltage on WL is high (which enables NMOS transistor 312), and the complementary wordline voltage on WLB is low (which enables PMOS transistor 320 and disables NMOS transistor 404). Unlike FIG. 3's embodiment, however, if the cell 400 is used in a common plateline architecture, the cell 400 will keep a limited or zero bias across the ferroelectric capacitor 302. More specifically, if WL is low (i.e., NMOS 312 is disabled) and WLB is high (i.e., PMOS 320 is disabled and NMOS 404 is enabled), the NMOS transistor 404 couples the storage node 306 to the plateline PL. Now if the plateline PL is pulsed high to write to an accessed cell in the plategroup, the voltage on the storage node 306 will tend to track the plateline voltage in the unaccessed cells. This keeps limited or zero bias across the ferroelectric capacitor 302 and the data bit stored in the cell will tend to remain in tact.

As the inventors have appreciated, the "tracking" in FIG. 4's embodiment, however, is not perfect. More specifically, the plateline voltage experiences a voltage drop when it passes over the NMOS transistor 404 to the storage node 306. Therefore, assuming the plateline voltage is $V_{DD}$, the voltage on the storage node 306, $V_{SN}$, will be as per the equation $V_{SN}=V_{DD}-V_T+V_T\{C_{FEC}/(C_P+C_{FEC})\}$. Here, the $V_T$ is the threshold voltage of the transistor 404, $C_{FEC}$ is the capacitance of the cell ferroelectric capacitor and $C_P$ is the parasitic capacitance (sum of all capacitances other than $C_{FEC}$) on the storage node. This formula is based on the fact that as the PL voltage rises from 0V to $V_{DD}-V_T$, the transistor 404 will conduct and the PL will be fully coupled to the storage node. But when the PL voltage equals or exceeds $V_{DD}-V_T$, the transistor 404 will no longer conduct and will now constitute a high resistance because the voltage difference between the gate of transistor 404 and storage node is less than $V_T$. However, the storage node will be still able to follow the PL substantially due to capacitive coupling from the ferroelectric capacitor. However the rise of the storage node voltage will be slightly reduced because of the presence of parasitic capacitance at the storage node.

Figure 5:
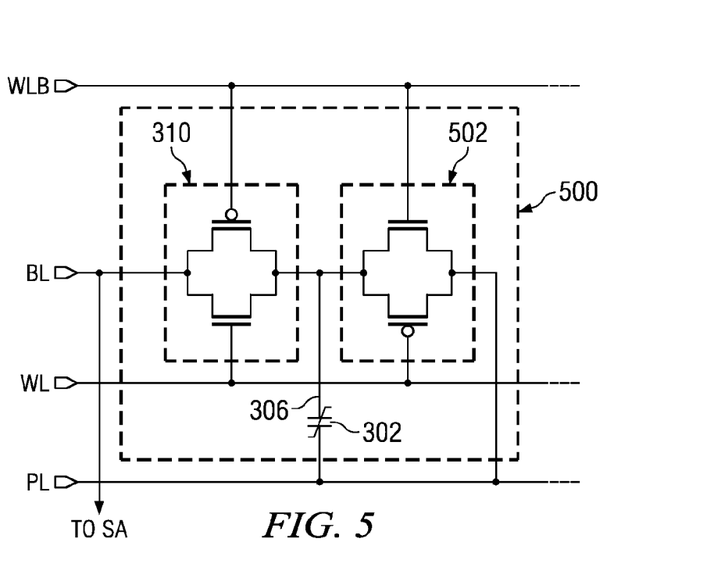
FIG. 5 is a schematic diagram illustrating one embodiment of a 4T1C ferroelectric memory cell in accordance with some aspects of the invention.

Since the storage node does not completely follow PL voltage, it could possibly put a voltage bias across the ferroelectric capacitor 302. As shown in FIG. 5, to further limit the voltage bias across the capacitor 302, the bias limiting circuitry 502 could comprise a complementary transmission gate 502. Relative to an NMOS transistor, the complementary transmission gate 502 (also called discharge transmission gate) has an additional p-ch transistor which will allow 0V across the ferroelectric capacitor 302 when the complementary transmission gate is 502 is enabled. To enable the complementary transmission gate 502 both n- and p-ch transistor are turned ON. In the FIG. 5, the discharge transmission gate is ON when the cell is not accessed and it is OFF when the cell is accessed (WL and WLB for this cell are activated with WL high and WLB low). The WL and WLB are connected to the p-ch and n-ch gates of the discharge transmission gate, respectively.

Figure 6:
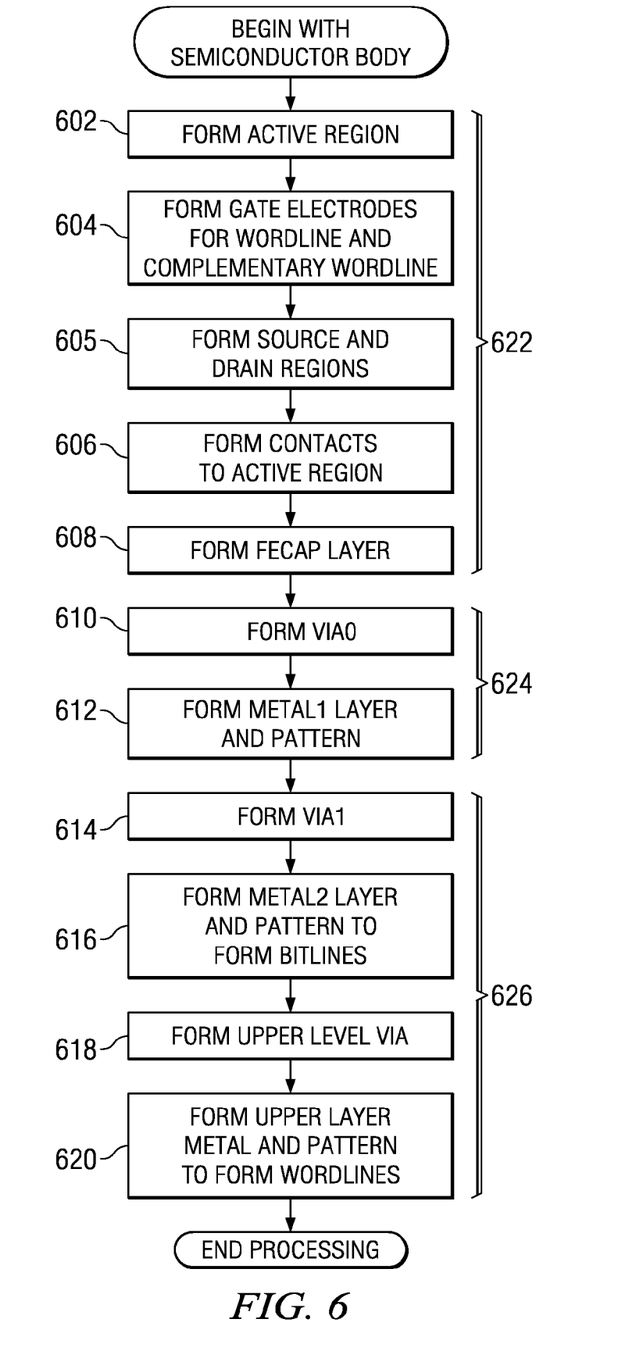
FIG. 6 is a flow diagram illustrating one embodiment of a method for forming a ferroelectric memory device in accordance with aspects of the invention.

Now that some embodiments of a ferroelectric memory device in accordance with some aspects of the invention have been set forth, several examples of methods for manufacturing these and other ferroelectric memory devices are now discussed with reference to FIGS. 6-10. FIG. 6 shows a somewhat general method 600, while FIGS. 7-10 show more detailed examples of implementations of the method with reference to a series of layout views. In these methods, a ferroelectric memory cell is formed that includes a complementary transmission gate. While the methods are illustrated and described below as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases. Additionally, while the discussion herein is made with reference to a ferroelectric memory device, it is to be appreciated that one or more aspects of the present invention may have application to different types of memories and/or to other structures or circuits not illustrated or described herein.

Referring now to FIG. 6, one can see the somewhat general method for manufacturing a ferroelectric memory cell with a complementary transmission gate and bias limiting circuitry. In block 602, active regions are formed within a semiconductor body. In block 604, gate electrodes, such as polysilicon gate electrodes, which may correspond to a wordline and a complementary wordline are formed over the semiconductor body. In block 605 n+ and p+ source and drain regions are formed. In block 606, a dielectric is formed over the gate electrode and contacts are formed through the dielectric to the active regions. In block 608, bottom electrode, ferroelectric dielectric and top electrode materials are formed and patterned to construct ferroelectric capacitors (FECAP). In block 610, via0's are formed through a dielectric layer overlying the top of the top electrode of the ferroelectric dielectric capacitor and over the contact regions where there are not ferroelectric capacitors. In 612, a metal1 layer is formed and patterned to form platelines. In 614, via1's are formed through the metal1 layer. In 616, a metal2 layer is formed and pattern to form bitlines. In 618, upper level vias are formed. Lastly, in block 620, an upper layer metal layer is formed and patterned to form wordlines. Typically Metal wordlines are connected to the polysilicon gate electrodes at the array edges to reduce wordline resistance over long distances. For purposes of clarity in the following figures, some steps may be grouped together as shown (e.g., blocks 602-608 may be grouped into block 622).

Figure 7A:
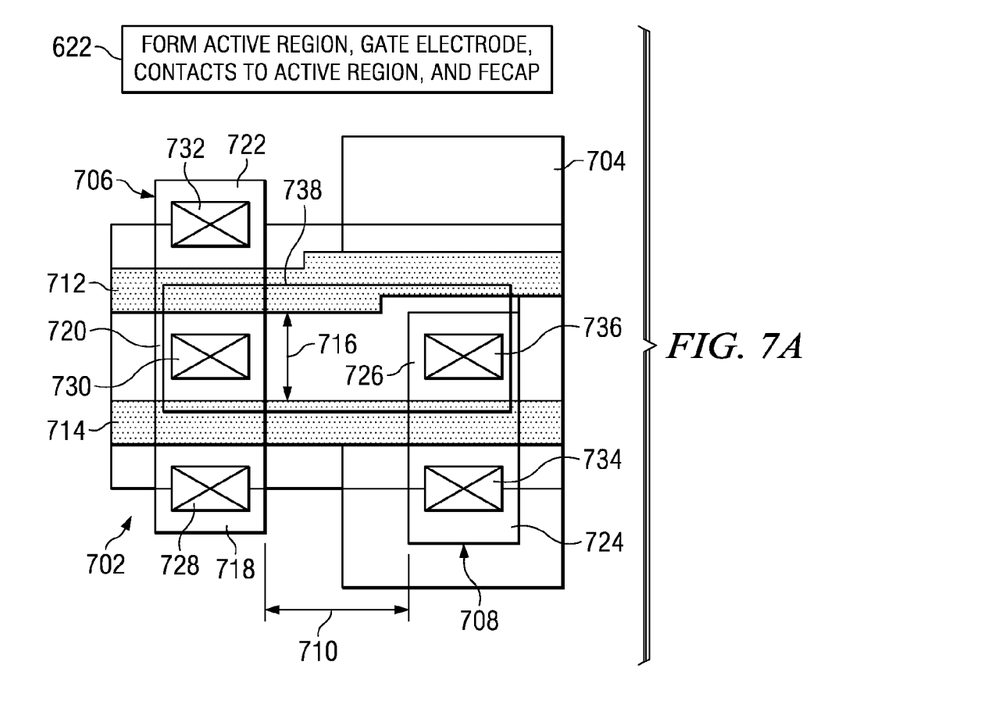
FIGS. 7A-7C show top layout views of a ferroelectric memory cell at various stages of manufacture in accordance with an embodiment consistent with the method of FIG. 6.
Figure 7B:
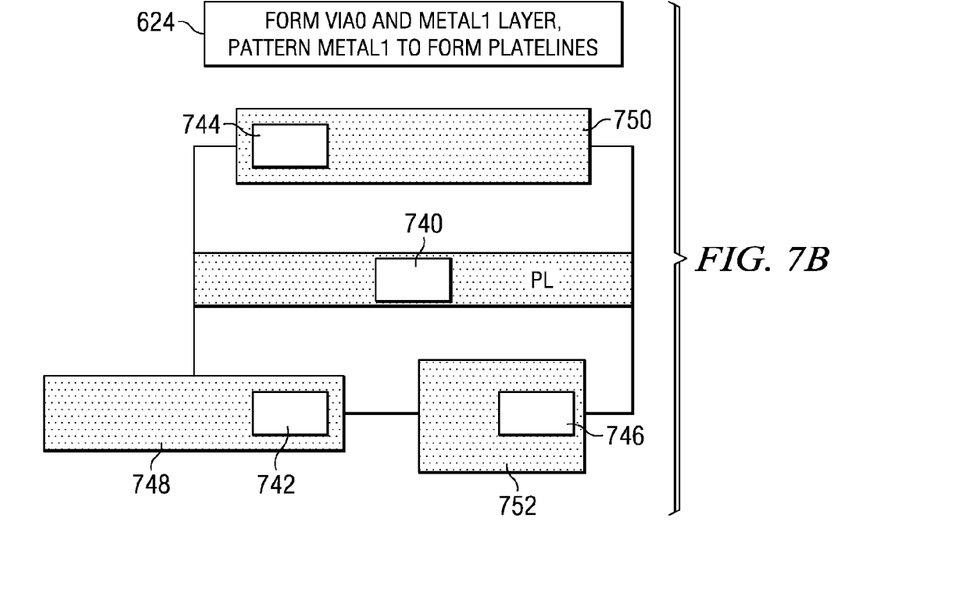
Figure 7C:
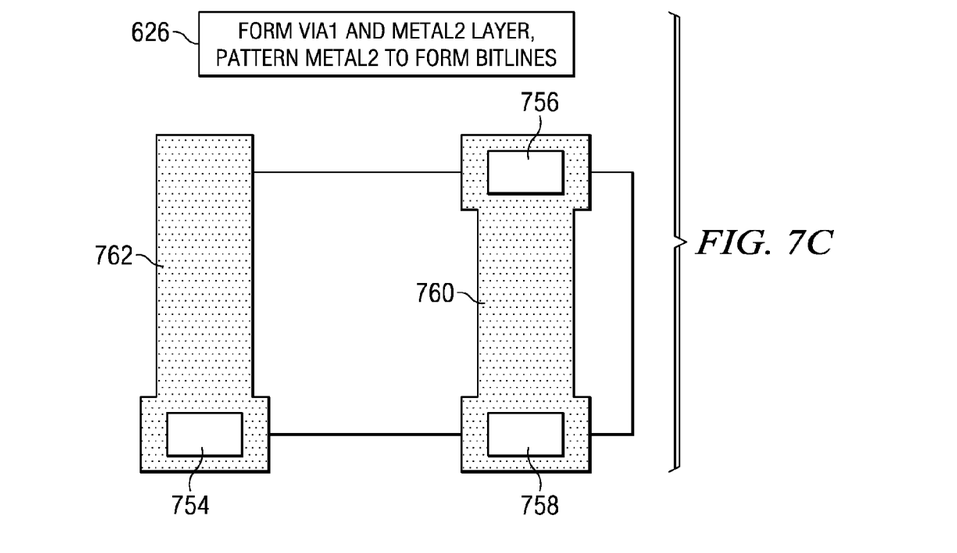

Referring now to FIGS. 7A-7C, one can see a more detailed method for manufacturing a ferroelectric memory cell with a complementary transmission gate and bias limiting circuitry. The method is merely one example of how FIG. 6's method could be implemented. These figures show top-layout views at various stages in the manufacturing process. Some layers may not be shown in all of the figures for purposes of clarity and readability.

As shown in FIG. 7A, one example of method 600 starts with a p-type substrate or p-well 702 (p-well), and an n-well 704 formed within the p-well 702. Next, a first active region 706 is formed in the p-well 702 and a second active region 708 is formed in the n-well 704. The first and second active regions 706, 708 are separated by a width 710 in the x-direction.

First and second gate regions 712, 714, respectively are then formed. The second gate region 714 runs in the x-direction over the first and second active regions 706, 708. The first gate region 712 runs in the x-direction over the first active region 708 and over the n-well region 704. The first and second gate regions 712, 714 are separated by a height 716 in y-direction. The gate region 712 is in the positive y-direction compared to the gate region 714.

When formed, the first and second gate regions 712, 714 will cover some regions of the first and second active areas, but leave other regions of the first and second active areas uncovered. Thus, the first active region 706 has three active regions not covered by the gate regions, namely, first uncovered active region 718, second uncovered active region 720, and third uncovered active region 722. The second active region 708 has two active regions not covered by the gate regions, namely fourth uncovered active region 724 and fifth uncovered active region 726.

Second uncovered active region 720 is between opposing inner sides of the first and second gate regions 712, 714. First uncovered active region 718 is on an outer side of the second gate 714 in the negative y-direction. Third uncovered active region 722 is on an outer side of first gate 712 in the positive y-direction. Fifth uncovered active region 726 is between opposing inner sides of the first and second gates 712, 714.

Fourth uncovered active region 724 is on an outer side of the second gate 714 in the negative y-direction.

After the first and second gates regions 712, 714 are formed, n+ source and drain regions are formed in the uncovered active regions 718, 720 and 722 and p+ source and drain regions are formed in the uncovered active regions 724 and 726. Next contacts 728, 730, 732, 734 and 736 are formed over the uncovered active regions 718, 720, 722, 724 and 726, respectively.

Next the FeCAP 738 is formed, wherein the bottom electrode of the FeCAP is formed over the contacts 730 and 736.

As shown in FIG. 7B, Via0's are formed. Via0 740 is formed over the top electrode of the FeCAP. Via0's (742, 744 and 746) are formed over the contacts 728, 732 and 734, respectively.

The plateline PL is formed in metal1 over via0 740. Metal1 landing pads 748, 750 and 752 are concurrently formed over 742, 746 and 744, respectively.

As shown in FIG. 7C Via1's are then formed, where Via1s 754, 756 and 758 are formed over 748, 750 and 752, respectively.

Finally, metal 2 is formed and patterned to form a bitline 760 and a VSS line 762.

It will be appreciated that although FIG. 7 shows merely one ferroelectric memory cell, that a number of such cells could be tiled together to form an array.

To form such an array, the cell could be mirrored or "flipped" in the x-direction at the cell boundary to form a cell containing two cells, which could also be called a "double cell." This double cell will have six transistors. The double cell can be mirrored in the x- and y-directions to form an array. The double cell can also be used as a complementary bit cell, where the two cells store complementary data as in 2T2C cells. The array architecture will support complementary bitlines for 6T-2C cell.

Figure 8A:
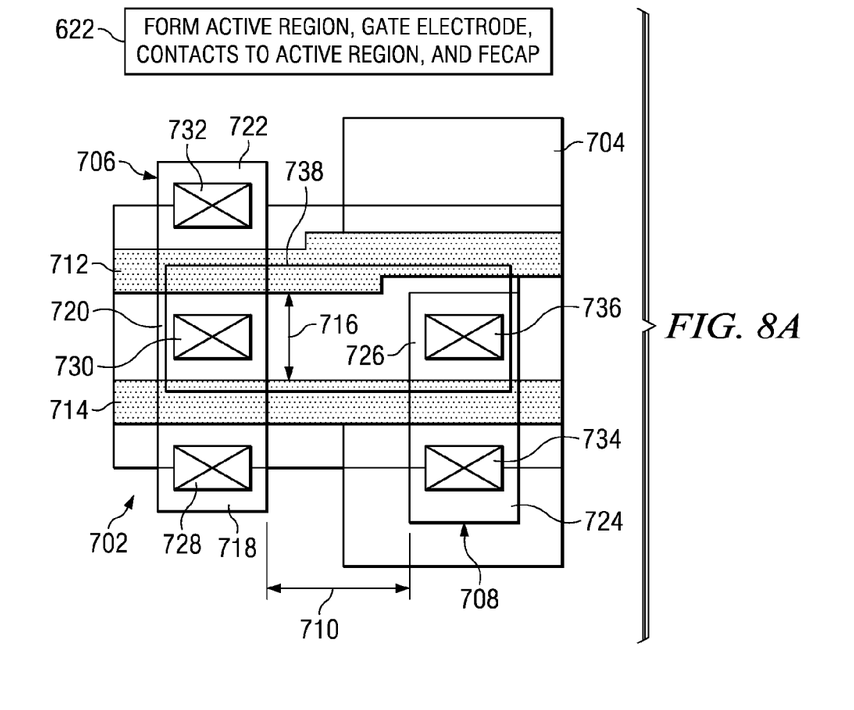
FIGS. 8A-8C show top layout views of a ferroelectric memory cell at various stages of manufacture in accordance with another embodiment consistent with the method of FIG. 6.
Figure 8B:
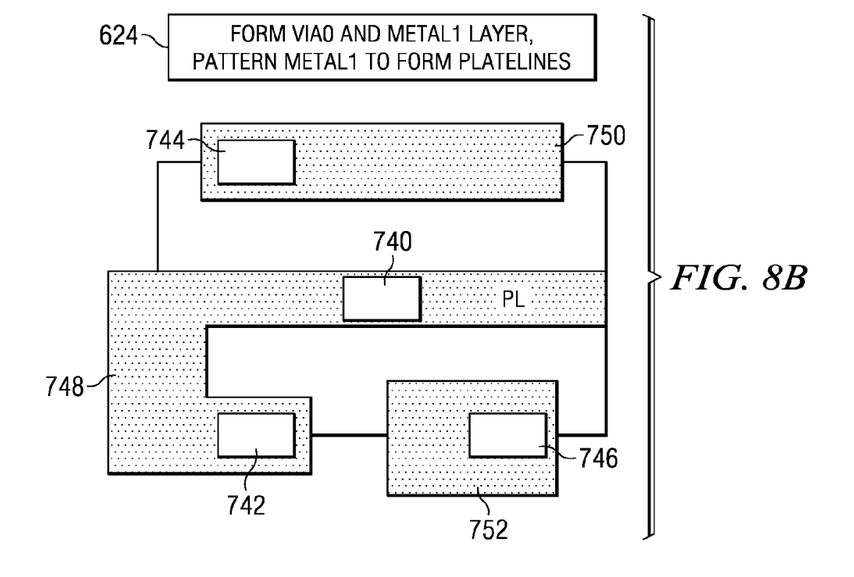
Figure 8C:
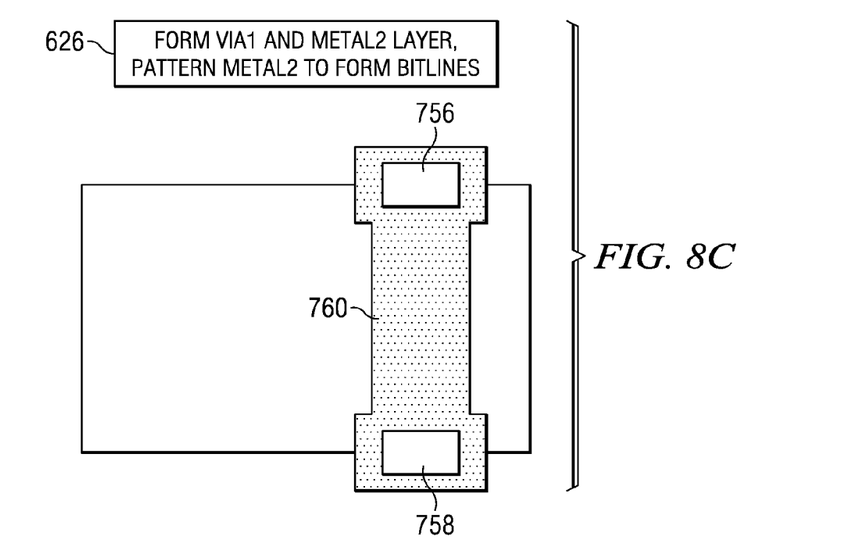

Referring now to FIGS. 8A-8C, one can see another more detailed method for manufacturing a ferroelectric memory cell with a complementary transmission gate and bias limiting circuitry, which method is merely one example of how FIG. 6's method could be implemented. As shown in FIG. 8A, the method starts with a p-type substrate or p-well 702 (p-well), and an n-well 704 formed within the p-well 702. Next, a first active region 706 is formed in the p-well 702 and a second active region 708 is formed in the n-well 704. The first and second active regions 706, 708 are separated by a width 710 in the x-direction.

First and second gate regions 712, 714, respectively are then formed. The second gate region 714 runs in the x-direction over the first and second active regions. The first gate region runs in the x-direction over the first active region and over the n-well region. The first and second gate regions are separated by a height 716 in y-direction. The gate region 712 is in the positive y-direction compared to the gate region 714.

When formed, the gate regions will cover some regions of the first and second active areas, but leave other regions of the first and second active areas uncovered. Thus, the first active region has three active regions that the gate regions do not cover, namely, first uncovered region 718, second uncovered active region 720 and third uncovered active region 722. The second active region has two active regions that the gate regions do not cover, namely fourth uncovered active region 724 and fifth uncovered active region 726. Second uncovered active region 720 is between opposing inner sides of gate 712 and gate 714. First uncovered active region 718 is on an outer side of gate 714 in the negative y-dir. Third uncovered active region 722 is on an outer side of gate 712 in the y-dir. Fourth uncovered active region 724 is on an outer side of gate 714 in the negative y-dir. Fifth uncovered active region 726 is between opposing inner sides of gate 712 and gate 714.

After the gates regions are formed, n+ source drain regions are formed in the uncovered active regions 718, 720 and 720 and p+ source drain regions are formed in the uncovered active regions 724 and 726. Next contacts 728, 730, 732, 734 and 736 are formed over the uncovered active regions 718, 720, 722, 724 and 726, respectively.

Next the FeCAP (738) is formed, wherein the bottom electrode of the FeCAP is formed over the contacts 730 and 736.

As shown in FIG. 8B, Via0's are formed. Via0 (740) is formed over the top electrode of the FeCAP, and Via0s (742, 744 and 746) are formed over the contacts (728, 732 and 734, respectively).

The plateline PL (748) is formed in metal1 over the Via0s 740 and 742, and Metal1 landing pads 750 and 752 are formed over Via0s 744 and 746, respectively.

As shown in FIG. 8C, Via1s are next patterned. The via1s 756 and 758 are formed over Metal1 landing pads 750 and 752, respectively.

Finally, metal2 is formed and patterned to fashion a bitline (760) for the cell over the via1s 756 and 758. It will be appreciated that although FIG. 8 shows merely one ferroelectric memory cell, that a number of such cells could be tiled together to form an array. To form such an array, the cell could be mirrored or "flipped" in the x-direction at the cell boundary to form a cell containing two cells, which could also be called a "double cell." This double cell will have six transistors. The double cell can be mirrored in the x- and y-directions to form an array. The double cell can also be used as a complementary bit cell, where the two cells store complementary data as in 2T2C cells. The array architecture will support complementary bitlines for 6T-2C cell.

Figure 9A:
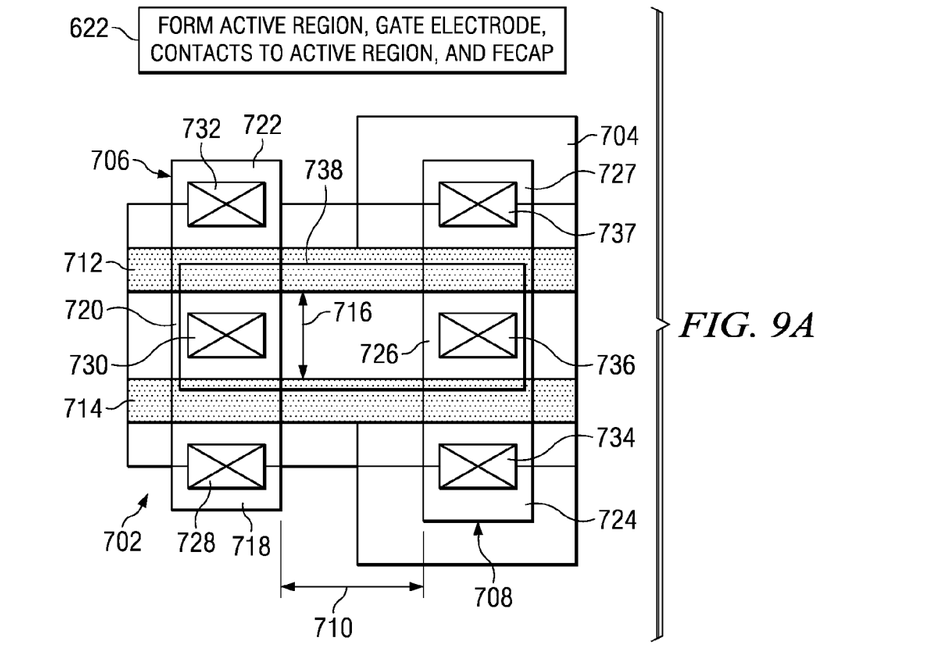
FIGS. 9A-9C show top layout views of a ferroelectric memory cell at various stages of manufacture in accordance with one embodiment consistent with the method of FIG. 6.

Referring now to FIG. 9A, another example of method 600 starts with a p-type substrate or p-well 702 (p-well), and an n-well 704 formed within the p-well 702. Next, a first active region 706 is formed in the p-well 702 and a second active region 708 is formed in the n-well 704. The first and second active regions 706, 708 are separated by a width 710 in the x-direction.

First and second gate regions 712, 714, respectively are then formed. The first gate region 712 runs in the x-direction over the first and second active regions 706, 708. The second gate region 714 also runs in the x-direction over the first and second active regions 706, 708. The first and second gate regions 712, 714 are separated by a height 716 in y-direction. The gate region 712 is in the positive y-direction compared to the gate region 714.

When formed, the first and second gate regions 712, 714 will cover some regions of the first and second active areas, but leave other regions of the first and second active areas uncovered. Thus, the first active region 706 has three active regions not covered by the gate regions, namely, first uncovered active region 718, second uncovered active region 720, and third uncovered active region 722. The second active region 708 also has three active regions not covered by the gate regions, namely fourth uncovered active region 724, fifth uncovered active region 726, and sixth uncovered active region 727.

Second uncovered active region 720 is between opposing inner sides of the first and second gate regions 712, 714. First uncovered active region 718 is on an outer side of the second gate 714 in the negative y-direction. Third uncovered active region 722 is on an outer side of first gate 712 in the positive y-direction. Fifth uncovered active region 726 is between opposing inner sides of the first and second gates 712, 714. Fourth uncovered active region 724 is on an outer side of the second gate 714 in the negative y-direction, and sixth uncovered active region 727 is on an outer side of the first gate 712 in the positive y-direction.

After the first and second gates regions 712, 714 are formed, n+ source drain regions are formed in the uncovered active regions 718, 720 and 720 and p+ source drain regions are formed in the uncovered active regions 724, 726 and 727. Next contacts 728, 730, 732, 734, 736, and 737 are formed over the uncovered active regions 718, 720, 722, 724, 726, and 727, respectively.

Next the FeCAP 738 is formed, wherein the bottom electrode of the FeCAP is formed over the contacts 730 and 736.

Figure 9B:
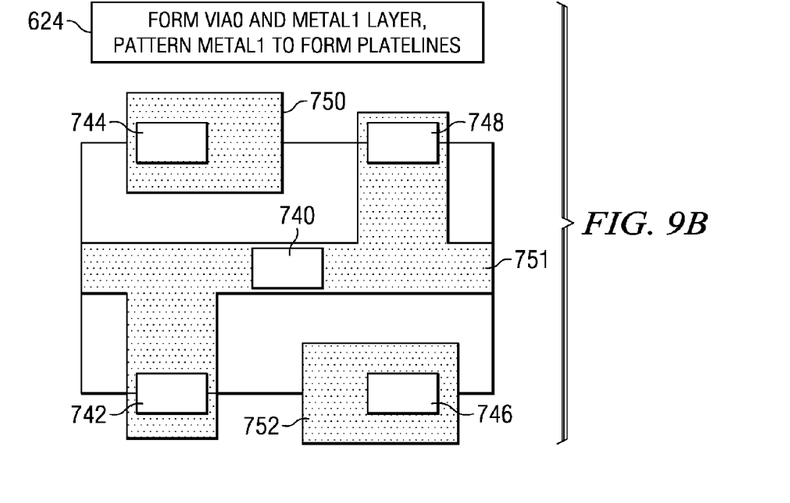

As shown in FIG. 9B, Via0's are formed. Via0 740 is formed over the top electrode of the FeCAP. Via0's (742, 744, 746 and 748) are formed over the contacts 728, 732, 734 and 737, respectively.

The PL 751 is formed in metal1 over the vias 740, 742 and 748. Metal1 landing pads 750 and 752 are concurrently formed over via0s 744 and 746, respectively.

Figure 9C:
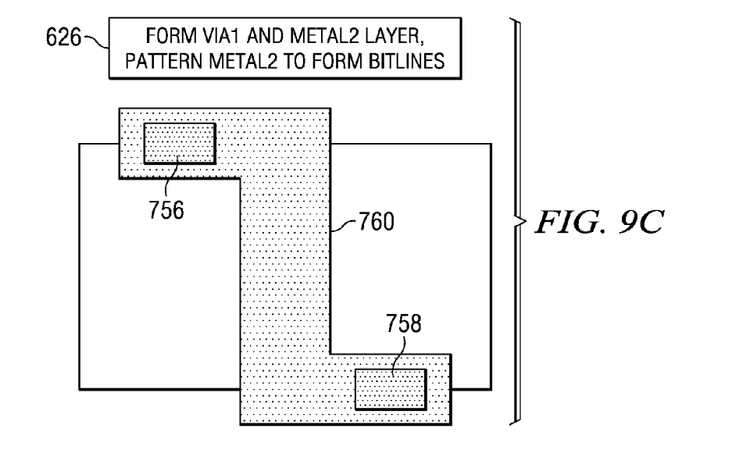

As shown in FIG. 9C, Via1 are patterned having Via1's 756 and 758 over 750 and 752, respectively.

Next, metal2 is formed and patterned to form a bitline (760). It will be appreciated that although FIG. 9 shows merely one ferroelectric memory cell, that a number of such cells could be tiled together to form an array. To form such an array, the cell could be mirrored or "flipped" in the x-direction at the cell boundary to form a cell containing two cells, which could also be called a "double cell." This double cell will have eight transistors. The double cell can be mirrored in the x- and y-directions to form an array. The double cell can also be used as a complementary bit cell, where the two cells store complementary data as in 2T2C cells. The array architecture will support complementary bitlines for 8T-2C cell.

Figure 10:
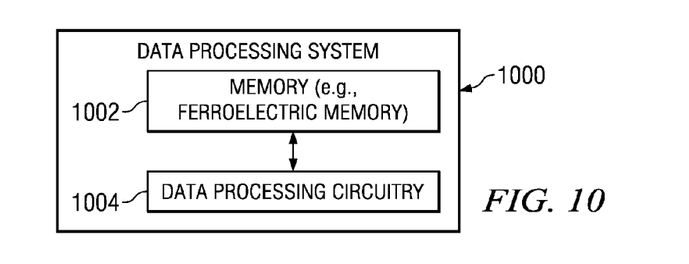
FIG. 10 shows a block diagram illustrating a data processing system that may use memory devices as described herein.

FIG. 10 shows an embodiment of a data processing system 1000 that comprises data processing circuitry 1002 configured to process data; and a memory device 1004 for storing the data. The memory device may be any memory device as described herein. For example, in one embodiment, the memory device 1004 can include an array of ferroelectric memory cells, where at least one of the ferroelectric memory cells has a storage node that is accessible via a complementary transmission gate. In one embodiment the data processing system 1000 could be a communication device, such as a cell phone, walkie-talkie, or pager, for example. In other embodiments, the data processing system 1000 could be a portable electronic product, such as a portable computer, cell phone, pager, camera, music device, voice recorder, etc. In still other embodiments, the data processing system 1000 could comprise an electronic system, such as a car, plane, industrial control system, etc.

Although several embodiments are illustrated and discussed in the context of ferroelectric memories, aspects of the present invention could also relate to other types of memory devices and methods associated therewith. Other types of memories that are contemplated as falling within the scope of the invention include, but are not limited to: random access memories (RAM), static random access memories (SRAM), dynamic random access memories (DRAM), read only memory (ROM), flash memory, EEPROM, and EPROM.

While examples of the invention have been illustrated and described with respect to one or more implementations, alterations and/or modifications may be made to the these examples without departing from the spirit and scope of the appended claims. For example, in some embodiments the WL and complementary WL signals may occur simultaneously, but in other embodiments the WL and complementary WL signals will not occur simultaneously. Thus, there may be delay between the WL and complementary WL signals which could be different between rising and falling edges. With respect to the bias liming circuitry, it is not necessary that the control signals for the bias limiting circuit are same as WL or WLB. They could be separate signals and could have various delays with respect to the WL and WLB signals as long as functionally they act in a similar way with respect to the discharge of the bias across the FeCAP.

Some functionality and corresponding features of the present device can be performed by hardware modules, software routines, or a combination of hardware and software. To the extent that software is employed, the software may be provided via a "computer readable medium", which includes any medium that participates in providing instructions to a memory device or a digital processor associated with the memory device. Such a computer readable medium may take numerous forms, including but not limited to, non-volatile media, volatile media, and transmission media. Non-volatile media includes, for example, optical or magnetic disks. Volatile media includes dynamic memory, such as ferroelectric memory, SRAM, or DRAM. Transmission media includes coaxial cables, copper wire, fiber optics, etc., and busses internal or external to a node. Transmission media can also include electromagnetic waves, such as a voltage wave, light wave, or radio wave.

In regard to the various functions performed by the above described components or structures (blocks, units, nodes, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit that includes a ferroelectric memory cell, the ferroelectric memory cell comprising:
    a ferroelectric capacitor having a first plate and a second plate, the first plate associated with a storage node of the ferroelectric memory cell and the second plate associated with a plateline;
    a complementary transmission gate configured to selectively couple the storage node to a bitline as a function of a wordline voltage and a complementary wordline voltage; and
    bias limiting circuitry configured to selectively alter voltage on the storage node.

2. The integrated circuit of claim 1 where the bias limiting circuitry is operable by the wordline voltage or the complementary wordline voltage.

3. The integrated circuit of claim 1, where the complementary transmission gate comprises:
    a parallel combination of an NMOS transistor and a PMOS transistor, where the wordline voltage is provided to a gate of the NMOS transistor and the complementary wordline voltage is provided to a gate of the PMOS transistor.

4. The integrated circuit of claim 1, where the complementary transmission gate comprises:
    an NMOS transistor comprising: a first n-type source/drain region coupled to the bitline, a gate on which the wordline voltage is provided, and a second n-type source/drain region coupled to the storage node;
    a PMOS transistor comprising: a first p-type source/drain region coupled to the bitline, a gate on which the complementary wordline voltage is provided, and a second p-type source/drain region that is coupled to the storage node.

5. The integrated circuit of claim 1, where the bias limiting circuitry is configured to selectively couple the storage node to $V_{SS}$.

6. The integrated circuit of claim 5, where the bias limiting circuitry comprises an NMOS transistor operable by the complementary wordline voltage.

7. The integrated circuit of claim 5, where the bias limiting circuitry comprises another complementary transmission gate including a NMOS transistor operable by the complementary wordline voltage and a PMOS transistor operable by the wordline voltage.

8. The integrated circuit of claim 1, where the bias limiting circuitry is configured to selectively couple the storage node to the plateline.

9. The integrated circuit of claim 8, where the ferroelectric memory cell is associated with an array of ferroelectric memory cells arranged in a common plateline configuration.

10. The integrated circuit of claim 8, where the bias limiting circuitry comprises an NMOS transistor operable by the complementary wordline voltage.

11. The integrated circuit of claim 8, where the bias limiting circuitry comprises another complementary transmission gate including a NMOS transistor operable by the complementary wordline voltage and a PMOS transistor operable by the wordline voltage.

12. A memory device, comprising:
    a memory array that includes a number ferroelectric memory cells arranged in columns and rows; where a row of the ferroelectric memory cells is associated with a wordline, a complementary wordline, and a plateline; and where a column of the ferroelectric memory cells is associated with a bitline;
    where a ferroelectric memory cell at an intersection of the row and the column comprises:
        a ferroelectric capacitor having a first plate and a second plate, the first plate associated with a storage node of the ferroelectric memory cell and the second plate associated with the plateline;
        a complementary transmission gate configured to selectively couple the storage node to the bitline as a function of a wordline voltage and a complementary wordline voltage; and
        bias limiting circuitry configured to selectively alter voltage on the storage node.

13. The memory device of claim 12 where the bias limiting circuitry is operable by the wordline voltage or the complementary wordline.

14. The memory device of claim 13, where the bias limiting circuitry is configured to selectively couple the storage node to the plateline or $V_{SS}$.

15. The memory device of claim 12, where the ferroelectric memory cell is associated with an array of ferroelectric memory cells arranged in a common plateline configuration.

16. A memory device, comprising:
a memory array that includes a number ferroelectric memory cells arranged in columns and rows; where a row of the ferroelectric memory cells is associated with a wordline, a complementary wordline, and a plateline; and where a column of the ferroelectric memory cells is associated with a bitline;
where a ferroelectric memory cell at an intersection of the row and the column comprises:
a ferroelectric capacitor having a first plate and a second plate, the first plate associated with a storage node of the ferroelectric memory cell and the second plate associated with the plateline;
a complementary transmission gate configured to selectively couple the storage node to the bitline as a function of a wordline voltage and a complementary wordline voltage; and
bias limiting circuitry configured to selectively alter voltage on the storage node;
where the ferroelectric memory cell further comprises:
a p-type region comprising a p-type substrate or p-well;
an n-type region formed within or laterally spaced from the p-type region;
a first active region formed in the p-type region;
a second active region formed in the n-type region and laterally separated from the first active region;
a first gate region that runs over the first active region; and
a second gate region that runs over the first and second active regions.

17. The memory device of claim 16:
where the first and second gate regions overlie the first active region to form a first uncovered active region that is on an outer side of the second gate region, a second uncovered active region that is between opposing inner sides of the first and second gate regions, and a third uncovered active region that is on an outer side of the first gate region; and
where the second gate region overlies the second active region to form a fourth uncovered active region that is on the outer side of the second gate and a fifth uncovered active region that is between the opposing inner sides of the first and second gate regions.

18. The memory device of claim 17, where the ferroelectric memory cell further comprises:
highly doped n+ source and drain regions formed in the first, second and third uncovered regions;
highly doped p+ source and drain regions formed in the fourth and fifth uncovered regions;
a first contact formed in the first uncovered active region;
a second contact formed in the second uncovered active region;
a third contact formed in the third uncovered active region;
a fourth contact formed in the fourth uncovered active region;
a fifth contact formed in the fifth uncovered active region; and
a ferroelectric capacitor comprising: a bottom electrode layer, a ferroelectric dielectric layer, and a top electrode layer; where the second and fifth contacts are coupled to the bottom electrode layer.

19. The memory device of claim 18, where the ferroelectric memory cell further comprises:
via0s and a metal 1 layer that are formed and patterned to form the plateline and landing pads associated with the memory cell and where a via0 couples the top electrode layer to the plateline in the metal1 layer.

20. The memory device of claim 17, where the ferroelectric memory cell further comprises:
via1s and a metal 2 layer that are formed and patterned to form the bitline associated with the memory cell.

21. A memory device, comprising:
a memory array that includes a number ferroelectric memory cells arranged in columns and rows; where a row of the ferroelectric memory cells is associated with a wordline, a complementary wordline, and a plateline; and where a column of the ferroelectric memory cells is associated with a bitline;
where a ferroelectric memory cell at an intersection of the row and the column comprises:
a ferroelectric capacitor having a first plate and a second plate, the first plate associated with a storage node of the ferroelectric memory cell and the second plate associated with the plateline;
a complementary transmission gate configured to selectively couple the storage node to the bitline as a function of a wordline voltage and a complementary wordline voltage; and
bias limiting circuitry configured to selectively alter voltage on the storage node;
where the ferroelectric memory cell further comprises:
a p-type region comprising a p-type substrate or p-well;
an n-type region formed within or laterally spaced from the p-type region;
a first active region formed in the p-type region;
a second active region formed in the n-type region and laterally separated from the first active region;
a first gate region that runs over the first and second active regions; and
a second gate region that runs over the first and second active regions.

22. The memory device of claim 21:
where the first and second gate regions overlie the first active region to form a first uncovered active region that is on an outer side of the second gate region, a second uncovered active region that is between opposing inner sides of the first and second gate regions, and a third uncovered active region that is on an outer side of the first gate region; and
where the second gate region overlies the second active region to form a fourth uncovered active region that is on the outer side of the second gate, a fifth uncovered active region that is between the opposing inner sides of the first and second gate regions, and a sixth uncovered active region that is on the outer side of the first gate region.

23. The memory device of claim 22, where the ferroelectric memory cell further comprises:
highly doped n+ source and drain regions formed in the first, second and third uncovered regions;
highly doped p+ source and drain regions formed in the fourth, fifth and sixth uncovered regions;
a first contact formed in the first uncovered active region;
a second contact formed in the second uncovered active region;
a third contact formed in the third uncovered active region;
a fourth contact formed in the fourth uncovered active region;
a fifth contact formed in the fifth uncovered active region;
a sixth contact formed in the sixth uncovered active region; and a ferroelectric capacitor comprising: a bottom electrode layer, a ferroelectric dielectric layer and a top electrode layer; where the second and fifth contacts are coupled to the bottom electrode layer.

24. The memory device of claim 23, where the ferroelectric memory cell further comprises:
via0s and a metal 1 layer that are formed and patterned to form the plateline and landing pads associated with the memory cell and where a via0 couples the top electrode layer to the plateline in the metal1 layer.

25. The memory device of claim 24, where the ferroelectric memory cell further comprises:
via1s and a metal 2 layer that are formed and patterned to form the bitline associated with the memory cell.

* * * * *